(12) United States Patent
Christange

(10) Patent No.: US 10,763,827 B1
(45) Date of Patent: Sep. 1, 2020

(54) DELAY LINE WITH CONTROLLABLE PHASE-SHIFTING CELLS

(71) Applicant: NXP B.V., Eindhoven (NL)

(72) Inventor: Henry Andre Christange, Egmating (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/555,443

(22) Filed: Aug. 29, 2019

(51) Int. Cl.
| H03H 11/20 | (2006.01) |
| H03H 11/26 | (2006.01) |
| H03H 11/04 | (2006.01) |

(52) U.S. Cl.
CPC .............. *H03H 11/20* (2013.01); *H03H 11/04* (2013.01); *H03H 11/265* (2013.01)

(58) Field of Classification Search
CPC ........ H03H 11/00; H03H 11/04; H03H 11/20; H03H 11/265; H03H 7/00; H03H 7/20; H03K 2005/00; H03K 2005/00286; H03K 5/00; H03K 5/13; H03L 7/00; H03L 7/0812
USPC ......................................................... 327/237
See application file for complete search history.

(56) References Cited

U.S. PATENT DOCUMENTS

| 4,733,203 A | 3/1988 | Ayasli | |
| 5,424,696 A | 6/1995 | Nakahara et al. | |
| 5,502,421 A * | 3/1996 | Nakahara | H03H 11/245 327/308 |
| 5,519,349 A * | 5/1996 | Nakahara | H03H 7/20 327/232 |
| 5,701,107 A * | 12/1997 | Kasahara | H03H 7/20 333/139 |
| 6,281,838 B1 | 8/2001 | Hong | |
| 6,356,166 B1 | 3/2002 | Goldsmith | |
| 6,600,294 B1 | 7/2003 | Dipiazza | |
| 6,674,341 B2 * | 1/2004 | Hieda | H03H 11/18 333/164 |
| 6,740,679 B1 | 5/2004 | Roe | |
| 6,806,792 B2 | 10/2004 | Penn | |
| 7,164,330 B2 | 1/2007 | Eom | |
| 7,239,218 B2 | 7/2007 | Nakamura | |
| 7,495,529 B2 | 2/2009 | Miyaguchi | |
| 8,988,165 B2 | 3/2015 | Staudinger | |
| 2004/0145429 A1 * | 7/2004 | Hieda | H03H 11/18 333/164 |

(Continued)

OTHER PUBLICATIONS

A. A. Bhonkar and U. Sutar, "3 bit balanced digital phase shifter using switch mode topology," 2016 International Conference on Automatic Control and Dynamic Optimization Techniques (ICACDOT), Pune, 2016, pp. 513-517, doi: 10.1109/ICACDOT.2016.7877638. (no date).*

(Continued)

*Primary Examiner* — Lincoln D Donovan
*Assistant Examiner* — Dave Mattison

(57) ABSTRACT

A delay line includes one or more phase-shifting cells, where each phase-shifting cell includes a high-pass filter circuit that may be selectively coupled to or decoupled from a transmission line. The filter circuit is couplable in parallel with the transmission line and shifts a signal conveyed through the transmission line by a predetermined phase angle. The high-pass filter circuit includes one or more capacitors and one or more reactance elements (e.g., inductors). The selective coupling may be achieved using multi-gate transistors.

20 Claims, 6 Drawing Sheets

(56) References Cited

U.S. PATENT DOCUMENTS

| | | | |
|---|---|---|---|
| 2005/0242993 A1* | 11/2005 | Hein | H01Q 3/22 342/375 |
| 2008/0180189 A1* | 7/2008 | Miya | H01P 1/18 333/103 |
| 2008/0180190 A1 | 7/2008 | Chan et al. | |
| 2008/0197936 A1 | 8/2008 | Berg et al. | |
| 2011/0057746 A1* | 3/2011 | Yamamoto | H01P 5/18 333/116 |
| 2016/0344430 A1 | 11/2016 | Srirattana et al. | |
| 2017/0187086 A1 | 6/2017 | Koul et al. | |
| 2017/0230028 A1 | 8/2017 | El Din et al. | |

OTHER PUBLICATIONS

D. Kang and S. Hong, "A 2-10 GHz Digital CMOS Phase Shifter for Ultra-Wideband Phased Array System," 2007 IEEE Radio Frequency Integrated Circuits (RFIC) Symposium, Honolulu, HI, 2007, pp. 395-398, doi: 10.1109/RFIC.2007.380909. (no date).*

M. Mabrouki, R. Ghayoula and A. Gharsallah, "Design of a 6-bits semiconductor integrated phase shifter for radar applications," 2016 2nd International Conference on Advanced Technologies for Signal and Image Processing (ATSIP), Monastir, 2016, pp. 824-829, doi: 10.1109/ATSIP.2016.7523196. (no date).*

Gupta, Shulabh et al; "Group-Delay Engineered Noncommensurate Transmission Line All-Pass Network for Analog Signal Processing"; IEEE Transactions on Microwave Theory and Techniques, vol. 58, No. 9; 16 pages (Sep. 2010).

Yongzhou, Zou et al; "New Differential Phase Shifters Using Novel Right-Handed Metamaterial Structures"; 2006 Int'l Symp. On Biophotonics, Nanophotonics and Metamaterials, IEEE; 3 pages (Oct. 2006).

Abbassi, M.A.B., et al. "A Compact Reconfigurable NRI-TL Metamaterial Phase Shifter for Antenna Applications" IEEE Transactions on Antennas and Propagation vol. 66, Issue 2, Article No. 8119859, pp. 1025-1030. (Feb. 2018) (Abstract Only).

Gong, Y., et al. "A Bi-Directional, X-Band 6-Bit Phase Shifter for Phased Array Antennas Using an Active DPDT Switch", 2017 IEEE Radio Frequency Integrated Circuits Symposium (RFIC), pp. 288-291. (Date of Conference: Jun. 4-6, 2017; Date Added to IEEE Xplore: Jul. 7, 2017).

* cited by examiner

DELAY LINE WITH CONTROLLABLE PHASE-SHIFTING CELLS

TECHNICAL FIELD

Example embodiments disclosed herein relate generally to RF signal processing.

BACKGROUND

A delay line may be used to introduce a phase shift for signals propagating on a transmission line. The shift may be controlled to satisfy the requirements of various applications. In order to ensure the wideband integrity of a phase-shifted signal, a low group-delay deviation is required. Well-designed pairs of networks are necessary to guarantee the same phase slope at different delay times over a wider frequency range There exist a number of strategies designing and connecting pairs of multiple networks with all-pass character. In addition to multistage all-pass structures, the most frequently used are certainly the switching between high and low pass and coupled lines with the principal functionality of the Shiffman coupler. In one type of semiconductor delay line switch structure, serial switches handle the connection of the delay specific lines. An input and output switch is typically used to connect one of the paired structures. Especially for high power, the losses of one switch only will be in the range of 0.5 dB (1 dB/per delay cell) and in multi-phase-shift application the number of serial connected switching cells determine the overall loss.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

It should be understood that the figures are merely schematic and are not drawn to scale. It should also be understood that the same reference numerals are used throughout the figures to indicate the same or similar parts.

DETAILED DESCRIPTION

Figure 1:
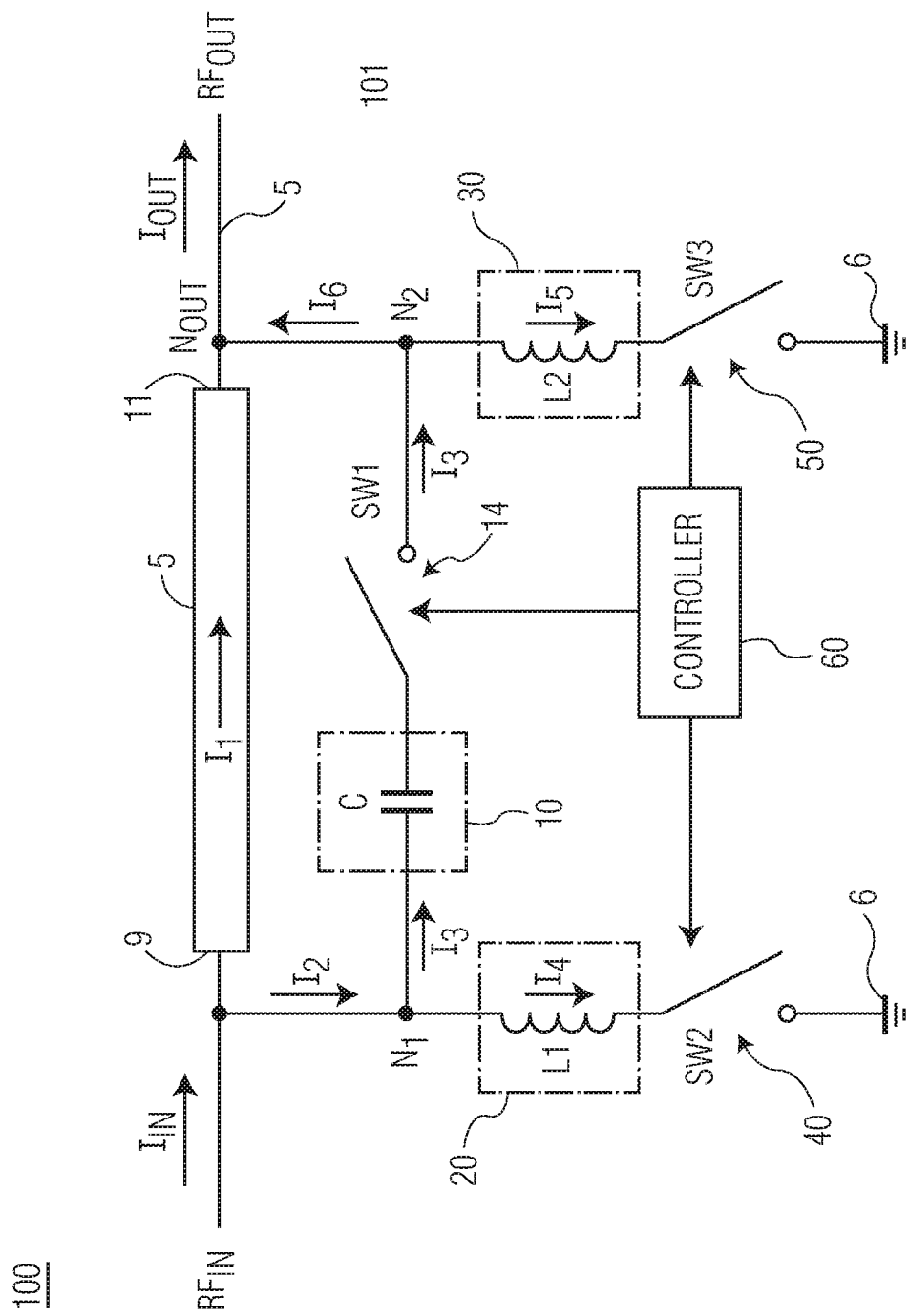
FIG. 1 illustrates an embodiment of a phase-shifting cell.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Embodiments of the inventive subject matter include delay lines (i.e., transmission lines configured to apply adjustable signal delays or phase shifts) that include one or more phase-shifting cells, each of which may be selectively controlled to alter a phase shift applied to an RF signal conveyed through the delay line. One or more embodiments avoids the use of switches to select one of the parallel paths. According to one approach, switches only will be used to connect a high pass structure in parallel to a transmission line. The switch losses are significantly lower in the range of 0.1 dB.

A well-designed parallel connection of a microstrip transmission line and a high-pass structure may generate comparable phase behavior as the a CRHLH-TL. In accordance with one or more embodiments, the same transmission line may be used in both phase switching modes. The low loss transmission line will be always part of the transmission network and can be directly connected serial without additional serial switches. Moreover, a phase shift may be generated due to the parallel connection of the high-pass structure. To generate a low group delay deviation over a midterm bandwidth, the length of the transmission line and the capacitor and inductor values of the parallel structure must be coordinated with each other.

One significant improvement of one or more embodiments described herein is that the dissipated power in both switching modes is very low, compared to typical switched matching structures. For a good delay/phase discretization, a large number of serial connections may be used. The basic idea is to accumulate the time delays of different line lengths. However, this also results in an accumulation of losses associated with the switched cells.

Attempts have been made to reduce these losses, including multiple port switches (SPxT), where x>2. But, in practice, such multiple port switches (SPxT) show higher losses than simple SP2T with comparable isolation and return loss. Therefore, the expected loss reduction of such approaches is limited. In high power applications, the loss problem is intensified. Moreover, available switching technologies may need special designs to handle higher currents and voltage levels. As used herein, the terms "delay line" and "transmission line" may be used interchangeably.

FIG. 1 illustrates an embodiment of a new kind of phase-shifting cell 100. The transmission line may be used to transmit various signals, including but not limited to radio frequency (RF) signals that convey information for various applications. In another application, the transmission line may carry power signals or another type of signal.

In a communications application, the transmission line TL may be coupled between a signal source (not shown) and a load (not shown), such as an antenna for transmitting RF signals in a predetermined frequency band. In this case, the transmission line TL may be included in a semiconductor device (e.g., a die, chip, chip package, etc.) or a printed circuit board. Such a semiconductor device or printed circuit board may be included, for example, in a cell tower or base station configured to communicate with mobile terminals (e.g., cellular telephones), which transmit/receive signals according to a predetermined standard (e.g., long-term evolution (LTE), 4G, 5G, or another standard). In another application, the transmission line may be coupled to a receiver or may carry power or other types of signals (on or off the chip or chip package).

The transmission line TL may have an electrical length based on signal type and/or to achieve a particular level of performance. The electrical length of a transmission line may be expressed in degrees or as a phase angle, e.g., proportional to the wavelength of signals propagating on the line. Because losses and other performance effects are based on the relationship between the electrical length of the transmission line and the wavelength of the propagating signals, the frequency of the signals is a relevant parameter, and indeed the electrical length of the transmission line may be specifically selected to correspond to a particular frequency band for a given application.

Referring to FIG. 1, each phase-shifting cell 100 includes a microstrip transmission line TL 5 and a high-pass filter circuit 101. The high-pass filter circuit 101 includes a capacitor 10, a first reactance 20, and a second reactance 30. The capacitor 10 is coupled in parallel across the TL 5. More specifically, a first terminal of the capacitor 10 is coupled to the first end 9 of the first conductor 5, and a second terminal of the capacitor is coupled to the second end 11 of the TL 5. The first reactance 20 may include an inductance L1 (e.g., a first inductor) with a first terminal coupled to the first terminal of capacitor 10 (or the first end 9 of the first conductor 5) and a second terminal coupled to a reference potential (e.g., ground 6). The second reactance 30 may include an inductance L2 (e.g., a second inductor) with a first terminal coupled to the second terminal of capacitor 10 (or the second end 11 of the first conductor 5) and a second terminal coupled to the reference potential (e.g., ground 6). The TL 5 may be arranged in parallel with a ground line or ground plane.

The first end 9 of the TL 5 may be an input, and the second end 11 of TL 5 may be an output, as indicated by the arrows in FIG. 1. In one embodiment, the microstrip transmission line TL may carry signals bidirectionally, in which case each of the first and second ends 9, 11 of the transmission line may serve as an input and an output. The first filter circuit 101 has been described as including a single high-pass filter, but filter circuit 101 may include multistage filter enhancing the bandwidth in another embodiment. Also, one or both of the first reactance 20 and the second reactance 30 may be a lumped component, a wire bond or an equivalent TL.

The filter circuit 101 (i.e., the capacitor 10 and the first and second reactances 20 and 30) may be selectively coupled in parallel with the TL 5 by closing corresponding switches 14, 40, and 50, which are also referenced in FIG. 1 as switches SW1, SW2, and SW3. The states of switches (e.g., open or closed, or more specifically current-conducting or non-current-conducting) may be controlled based on control signals generated by a controller 60. The controller 60 may be on or off the die, chip, chip package, or printed circuit board that includes the phase-shifting cell 100.

The switches 40 and 50 are connected between the second terminals of the first and second reactances 20, 30, respectively, and a reference potential (e.g., ground 6). In an alternate embodiment, the switches 40, 50 may be connected between the input and output ends 9, 11 of TL 5 and the first terminals of the first and second reactances 20, 30, respectively. Switch 14 is coupled between the second terminal of capacitor 10 and the second end 11 of TL 5. Alternatively, switch 14 may be coupled between the first end 9 of TL5 and the first terminal of capacitor 10. The switches 14, 40, and 50 may be implemented, for example, using field effect transistors (FETs) (e.g., metal oxide semiconductor FETs (MOSFETs)). In one embodiment, one or more, or all, of the transistors may be multiple-gate FETs.

During operation, the controller 60 generates control signals to control the states of switches 14, 40, and 50 in order to affect the phase shifting of an input signal (e.g., $RF_{IN}$) by a predetermined phase angle (or equivalently, phase delay). In this embodiment, no additional phase-shift elements or switches are connected in series with the inputs and outputs of the microstrip transmission line.

According to an embodiment, the switches 14, 40, 50 are controlled in order to "activate" or "couple" the filter circuit 101 (i.e., when all switches 14, 40, 50 are closed), or to "deactivate" or "decouple" the filter circuit 101 (i.e., when all switches 14, 40, 50 are open). When the filter circuit 101 is deactivated (i.e., all switches 14, 40, 50 are open and the filter circuit 101 is decoupled from MTL 5), the embodiment presents itself as simple TL with a predetermined phase (delay time) behavior. In contrast, when the filter circuit 101 is activated (i.e., the filter circuit 101 is connected in parallel with TL 5 by closing all switches 14, 40, 50) the embodiment is a parallel connection of a left hand (TL) and right-hand (High-Pass) transmission network. Specific to the selected length of the TL 5, values of C and L can be calculated in such way that the structure generates an additional phase delay with the same phase slope as the TL 5 by itself over a wider frequency range.

The maximum current handling and the breakdown voltages limit the maximum power level of semiconductor switches. The analyses of the voltages and current distribution of the embodiment offers the advantage of such a phase switching cell. The highest current in ON-State is flowing through SW1. Larger switches for high current handling suffer in the isolation in OFF state. The serial connection with the C significantly increase the isolation in OFF-State. If the phase shift of the TL is below 60°, the voltage swing from node 9 to 11 will be below the amplitude level of a 50 Ohm system to ground at the same power level. Also, that helps, because it reduces the necessary minimum number of multi-gate structures and therefore the losses compared to traditional switching cells. In a simplified way it can be said that the capacity determines more or less the transmission phase behavior, while the inductances 20 and 30 adjust the characteristic impedance of switching cell.

For this purpose, the current $I_4$ may be passed through the inductor L1 to ground will be very low. In one embodiment, the current $I_4$ through the inductor L1 may be around 20 dB below the path through the capacitor 10 when switch SW1 is closed. At this level, the quality factor (Q) of the inductor and the $R_{on}$ losses of the switch SW2 may play a subordinate role. Also, in one embodiment, the switch SW2 may handle the full voltage swing when the switches are open. In order to achieve this performance, switches SW2 and SW3 may be multi-gate switches, and switch SW2/3 may have a greater number of gates than switch SW1. This greater number of gates helps for a reduction in leakage losses to ground.

Figure 2:
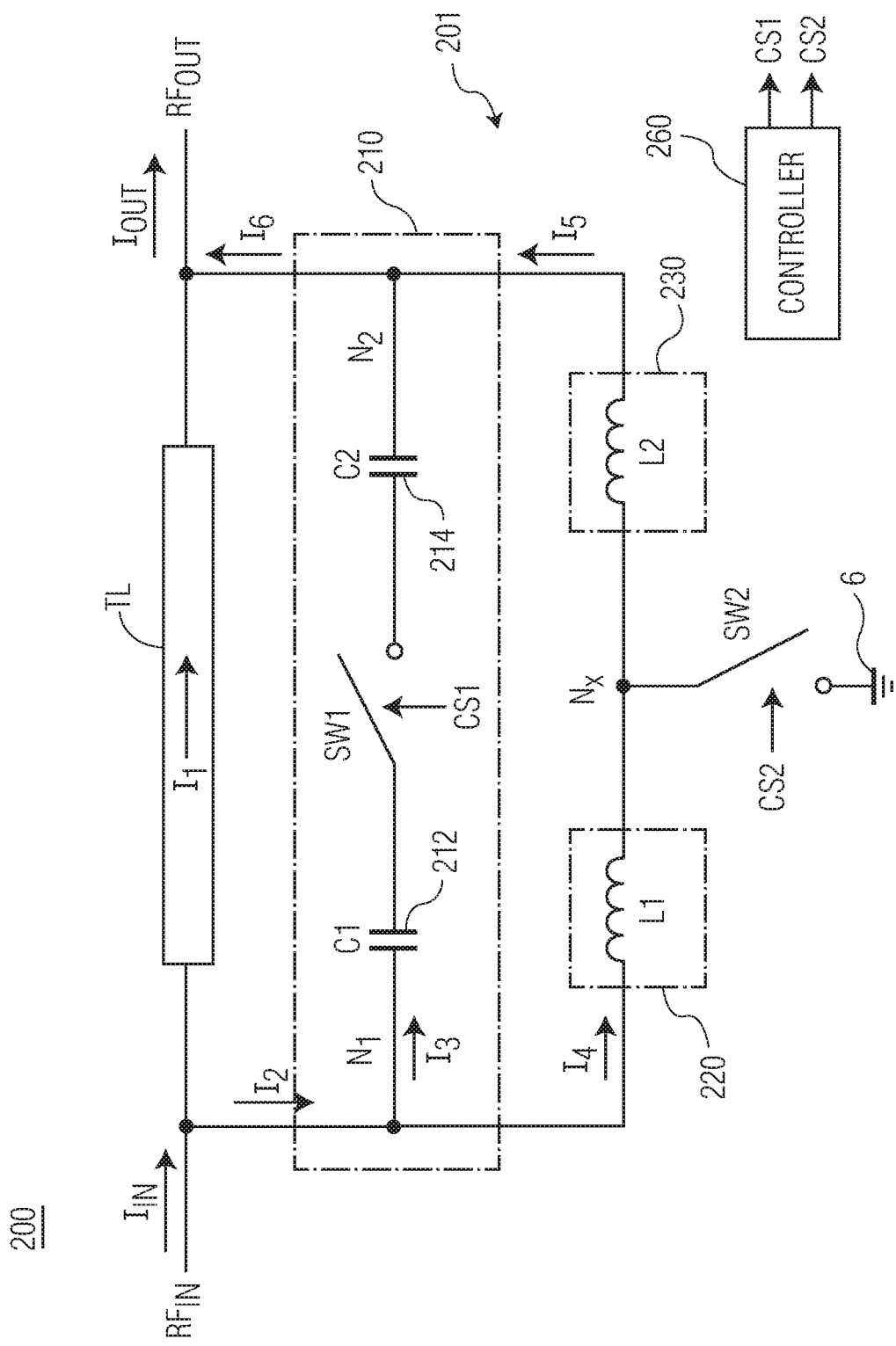
FIG. 2 illustrates another embodiment of a phase-shifting cell.

FIG. 2 illustrates another embodiment of a phase-shifting cell 200 for a microstrip transmission line TL 5. It is the result of the technical analysis of FIG. 1 and represents a simplification that only requires two active switches. The phase shifting cell includes a high-pass filter 201 that in turn includes a filter 210, a first reactance 220, and a second reactance 230 that may be selectively coupled to a first conductor 5 of the transmission line. The filter 210 includes a switch SW1 to selectively couple a first capacitor (C1) 212 in series with a second capacitor (C2) 214. The first reactance 220 may include an inductor L1 and the second reactance 230 may include an inductor L2. The inductors L1 and L2 may be coupled to one another through a node $N_X$ and in parallel with the filter 210 and the microstrip transmission line TL. The node $N_X$ is coupled to a reference potential (e.g., ground) through a switch SW2. In operation, switches SW1 and SW2 are either both switched on to activate the phase-shifting cell 200 or both switched off to deactivate the phase-shifting cell 200. A controller 260 may control the on/off states of the switches.

When all switches are turned off (i.e., opened), the main RF current will flow through the transmission line. Only a very small part of the RF current flows through the high impedance pass of the serial inductances L1, L2. The small impedance changes of the system (in OFF-state) through the parallel connection of transmission line and the inductances can be adjusted over the width of MTL5. Due to the embedding of the switch SW1 with two serial caps C1 and C2, the influence of the parasitic ground capacitance of switch SW1 is significantly reduced. It helps also to increase the voltage handling due to the additional voltage division. When all switches are turned on, the behavior of the embodiment is equivalent to embodiment 100: If all inductance and capacitance values calculated well, the embodiment generates an additional delay time with same phase slope over a wider frequency range.

Figure 3:
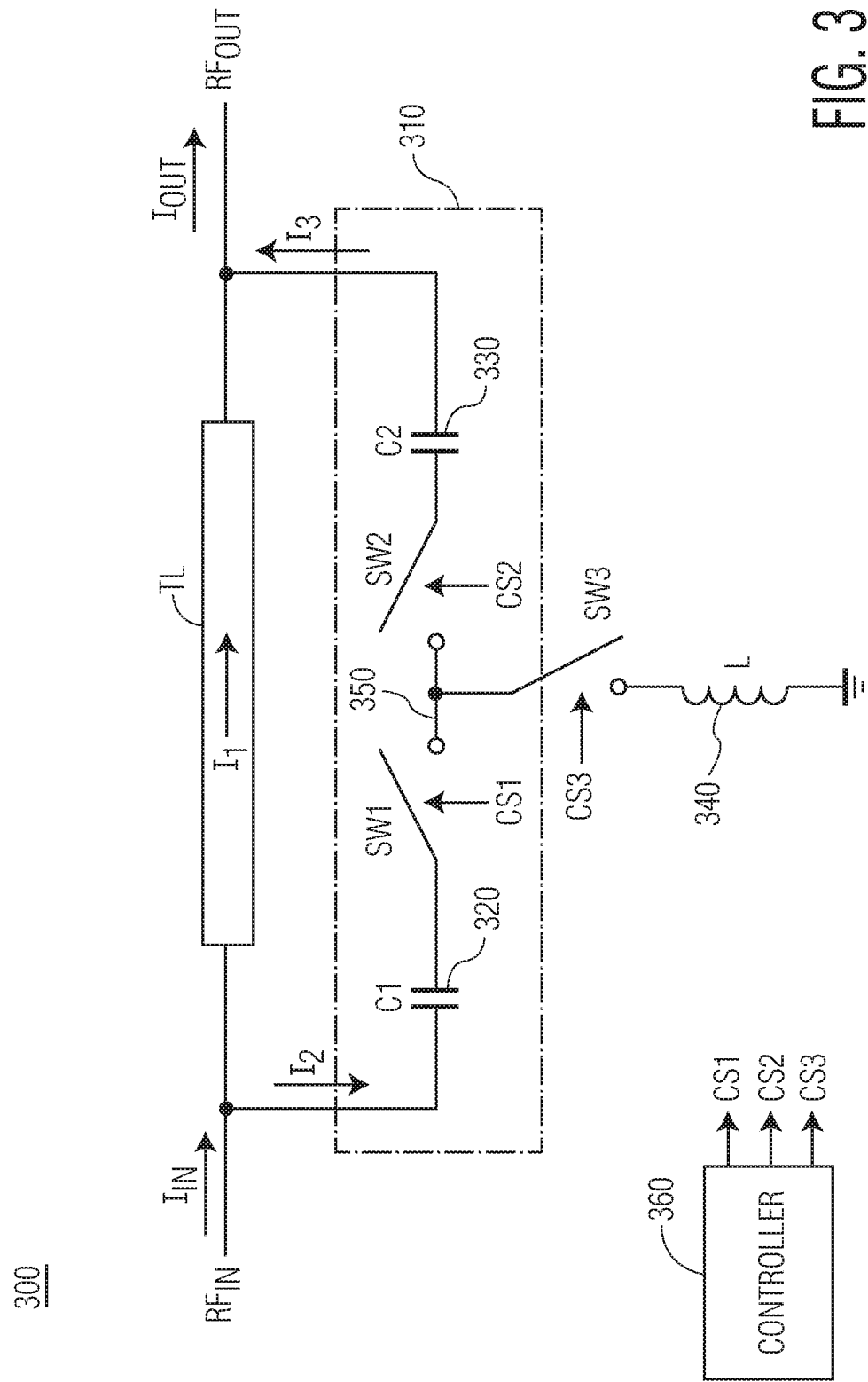
FIG. 3 illustrates another embodiment of a phase-shifting cell.

FIG. 3 illustrates another embodiment of a phase-shifting cell 300 which has similar behavior as phase-shifting cell 100 and 200. Other than embodiment 100 and 200, it does not sets a PI-equivalent but a T-equivalent circuit diagram of a high pass structure. except that only one switch 350 and one reactance (L). In this embodiment, the switch 350 is a three-way switch with three switch paths SW1, SW2, and SW3. The switch is coupled between capacitor (C1) 320 and capacitor (C2) 330 of filter 310, and a node between the capacitors is coupled through the switch to the inductor 340. As with other embodiments, switch paths SW1, SW2, and SW3 are either all turned on or all turned off. Controller 360 generates control signals CS1, CS2, and CS3 for controlling the states of respective ones of the switch paths.

When all switches (SW1, SW2, SW3) are off, the circuit delivers the behavior of delay and phase slope of the microstrip transmission line TL 5. When all three switch paths are turned on, the parallel connected high pass increase the delay time while retaining the phase slope over a wider frequency range. The solution of an analytical calculation delivers the values for inductances and capacitances in dependency of the length of the transmission line. An advantage of this structure is that also the multi-gates of the switches SW1 and SW2 divide the maximum voltage swing and therefore reduce the necessary minimum number of gates for the third switch SW3. In one embodiment, the transistor used for SW3 may have a different number of gates compared to the transistors used for SW1 and SW2.

In accordance with one or more of the aforementioned embodiments, the switches may be formed from MOSFET transistors, each having a plurality of gates. The number of gates may vary from transistor to transistor, for example, to produce different effects or levels of performance. For example, a transistor having a greater number of gates may provide improved leakage losses compared to a transistor with fewer gates. In other embodiments, the switches may be formed from other types of transistors, including but not limited to other types of FET transistors and bipolar junction transistors (BJTs).

Figure 4:
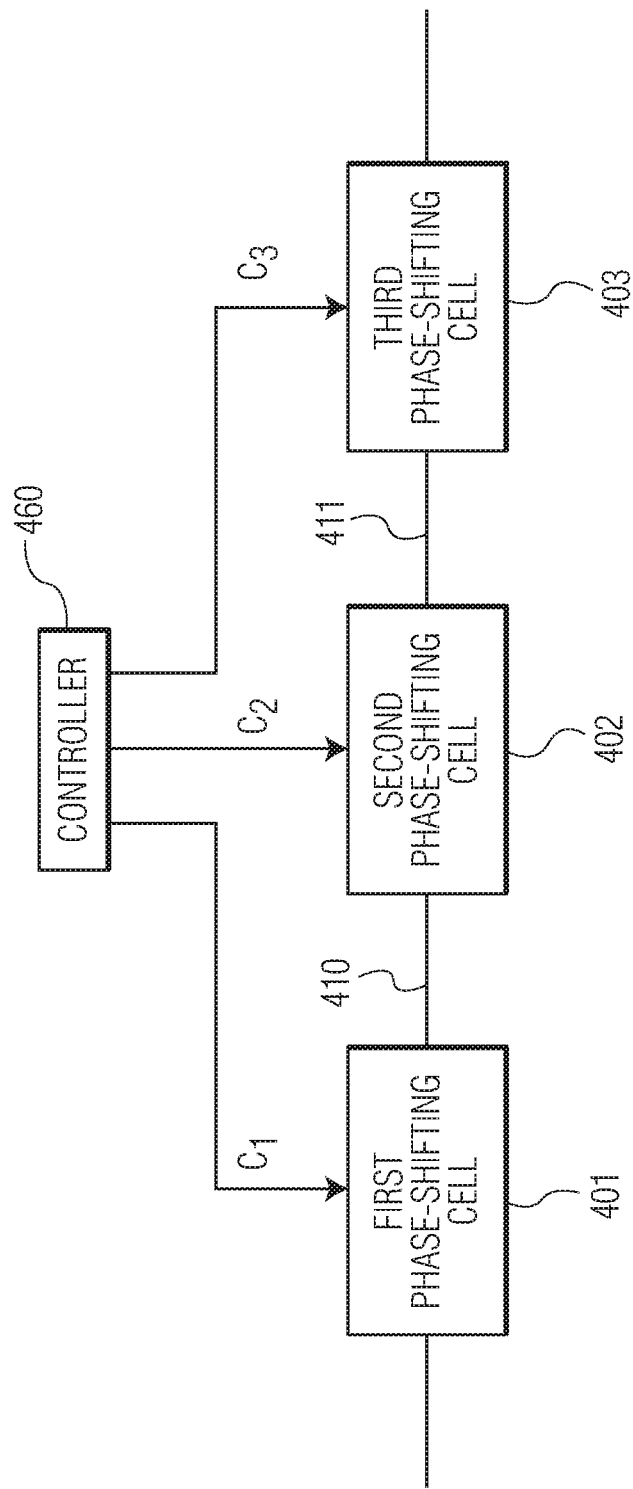
FIG. 4 illustrates an embodiment of a 3-bit switch.

FIG. 4 illustrates an embodiment of a delay line 400 with multiple phase-shifting cells 401-403 that may be controlled using a multibit control value. More specifically, FIG. 4 illustrates a delay line 400 in which multiple phase-shifting cells 401, 402, 403 are coupled in series and where each of the phase shifting cells 401-403 may be selectively controlled to apply (or not to apply) a predetermined phase shift to an RF signal conveyed along the transmission line.

According to various embodiments, each of the phase shifting cells 401-403 may have a configuration that is identical or substantially similar to one of phase-shifting cells 100, 200, 300 (FIGS. 1-3). The phase-shifting cells 401-403 may have identical schematic configurations or different schematic configurations, in various embodiments. In addition, the corresponding component values (e.g., for capacitors 10, 212, 214, 320, 330 and reactances 20, 30 220, 230, 330) may be identical in each of the phase-shifting cells 401-403 so that each cell 401-403 may apply the same phase shift, when activated, or the corresponding component values could be different in each of the phase-shifting cells 401-403 so that each cell 401-403 may apply a different phase shift, when activated.

A multibit control value could be provided to the controller 460 by external circuitry, which indicates which combination of the multiple phase-shifting cells 401-403 should be activated to apply a phase shift along the transmission line. The multibit control value may have a number of bits that is equal to the number of series-coupled phase-shifting cells, for example, where each bit corresponds to one of the phase-shifting cells.

In the example of FIG. 4 in which three series-coupled phase-shifting cells 401-403 are implemented, a three-bit control value ($C_1C_2C_3$) could be provided to the controller 460. Each bit of the multibit control value could correspond to one of the three phase-shifting cells 401-403, and the state of each bit ($C_1$, $C_2$, and $C_3$) in the three-bit control value can indicate whether or not the controller 460 should send switch control signals to activate or deactivate the corresponding ones of the phase-shifting cells 401-403. For example, a bit value of "0" may indicate that the controller 460 should not activate the corresponding cell, and a bit value of "1" may indicate that the controller 460 should activate the corresponding cell, or vice versa. Although the example of FIG. 7 illustrates three phase-shifting cells 401-403 coupled in series, other systems may include only two series-coupled phase-shifting cells, or more than three series-coupled phase-shifting cells. In such systems, the multibit control value may have as few as two bits or more than three bits.

In some embodiments, each of the phase-shifting cells 401-403 may be configured to apply a same phase shift, when activated (e.g., each may be configured to apply a same phase shift in a range of about 1 degree to about 20 degrees). In other embodiments, some or all of the phase shifting cells 401-403 may be configured to apply different phase shifts, when activated (e.g., each may be configured to apply a different phase shift in a range of about 1 degree to about 20 degrees). For example, phase-shifting cell 401 may be configured to apply a phase shift of about 2.5 degrees, when activated, phase-shifting cell 402 may be configured to apply a phase shift of about 5 degrees, when activated, and phase-shifting cell 403 may be configured to apply a phase shift of about 10 degrees, when activated. In other embodiments, phase-shifting cells may be configured to apply smaller, larger, or different values than the example values given above.

In the three-bit control value embodiment discussed above, control values may range from 0,0,0 to 1,1,1, which enables the phase shifter 400 to responsively apply phase shifts in a range of about 0 degrees to 17.5 degrees in 2.5 degree increments, assuming that the minimum phase shift through the transmission line (or any transmission line segment) when all phase-shifting cells are deactivated is 0 degrees. In actuality, the minimum phase shift through the transmission line (or any transmission line segment) may be more than 0 degrees. However, the minimum phase shift through any transmission line segment is smaller when the corresponding high-pass filter circuit is decoupled through the transmission line segment than when the corresponding high-pass filter circuit is coupled to the transmission line segment. For ease of description, the minimum phase shift is assumed to be 0 degrees in the below example.

Given the above-described example, the table, below, lists each possible multi-bit control value and the total phase shift applied by the phase shifter 500 for each possible control value. In other embodiments, some or all of the phase-shifting cells 401-403 may apply phase shifts that are different from the above-listed example phase shifts, which may enable smaller or larger ranges of total phase shifts (i.e., smaller or larger than 17.5 degrees), and/or may enable smaller or larger increments between adjacent total phase shift values (i.e., smaller or larger than 2.5 degrees).

TABLE 1

Multibit control values and total phase shifts

| Control value\bit:cell | Bit 3: Cell 403 (10 degrees) | Bit 2: Cell 402 (5 degrees) | Bit 1: Cell 401 (2.5 degrees) | Total Phase Shift |
|---|---|---|---|---|
| 0,0,0 | 0 (0 degrees) | 0 (0 degrees) | 0 (0 degrees) | 0 degrees |
| 0,0,1 | 0 (0 degrees) | 0 (0 degrees) | 1 (2.5 degrees) | 2.5 degrees |
| 0,1,0 | 0 (0 degrees) | 1 (5 degrees) | 0 (0 degrees) | 5.0 degrees |
| 0,1,1 | 0 (0 degrees) | 1 (5 degrees) | 1 (2.5. degrees) | 7.5 degrees |
| 1,0,0 | 1 (10 degrees) | 0 (0 degrees) | 0 (0 degrees) | 10 degrees |
| 1,0,1 | 1 (10 degrees) | 0 (0 degrees) | 1 (2.5 degrees) | 12.5 degrees |
| 1,1,0 | 1 (10 degrees) | 1 (5 degrees) | 0 (0 degrees) | 15 degrees |
| 1,1,1 | 1 (10 degrees) | 1 (5 degrees) | 1 (2.5 degrees) | 17.5 degrees |

The controllers, filters, and other signal-generating and signal-processing features of the embodiments disclosed herein may be implemented in logic which, for example, may include hardware, software, or both. When implemented at least partially in hardware, the controllers, filters, and other signal-generating and signal-processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, filters, and other signal-generating and signal-processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Figure 5:
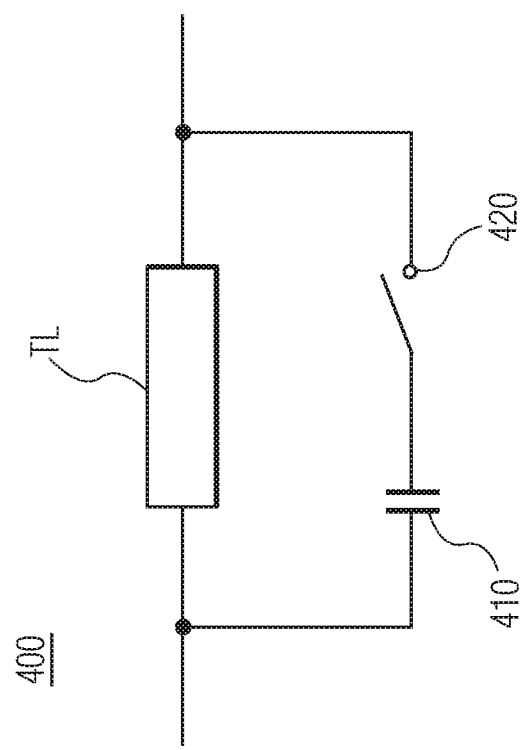
FIG. 5 illustrates an embodiment of a phase-shifting cell without optimized return loss.

FIG. 5 illustrates another embodiment of a phase-shifting cell 400. This configuration presents a simplification of the switching cell 100 and 200 and includes a capacitor 410 which is selectively coupled to the transmission line TL by a switch 420. Especially for small TL with a phase-shift below around 10°, such configuration can make sense. Of course, the connection of only one reactive component (C1) will always chance the impedance of the structure. However, if the requirements of the input return loss allow this, only one switch is necessary. The low RF voltage swing over the short TL also reduces the requirement of the voltage handling of the switch. Therefore, a very attractive low loss cell can be designed. As a compromise, for the best mean return loss between the two switching modes, for example a 60 Ohm transmission can be used. Such a transmission line may impose a predetermined phase shift, e.g., 8.7°, using a 7 pF capacitor 410. Together with the transformation of the parasitic of the switch, a return loss <−20 dB can be realized for both delay modes.

Figure 6:
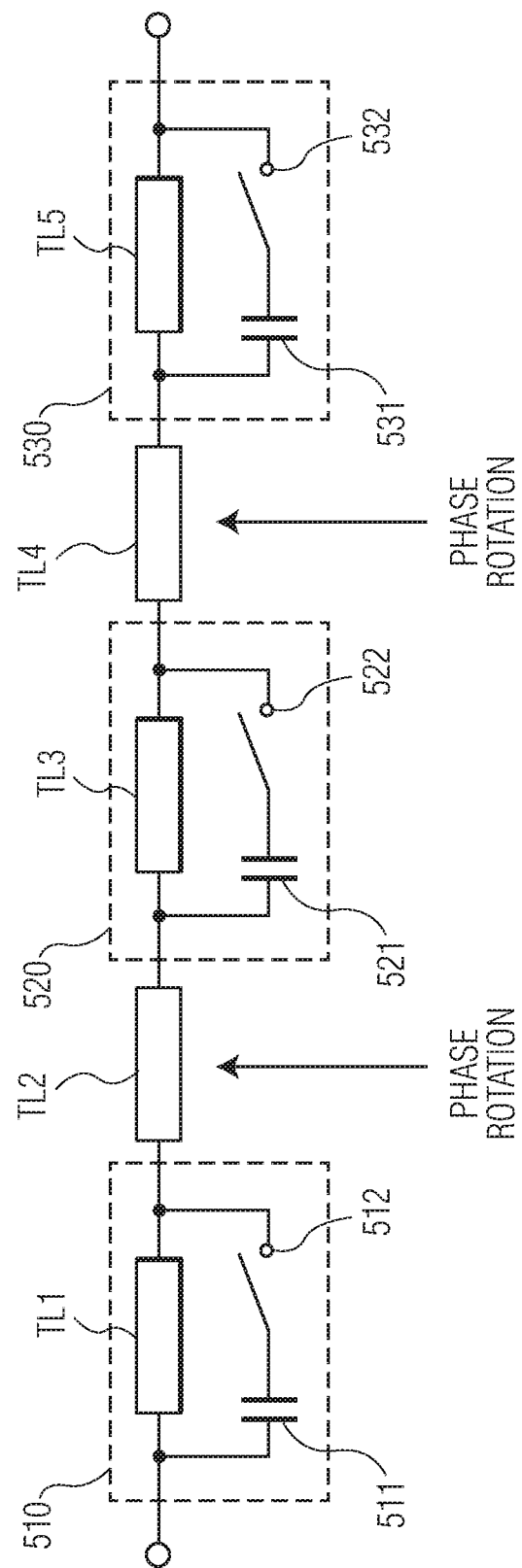
FIG. 6 illustrates an embodiment of a of a 3-bit switch with simplified switching cells.

FIG. 6 illustrates an example of a 3-bit configuration for a low phase-shift circuit 500, which may be used for additional calibration structures as part of larger multibit phase shifter. The low phase-shift circuit 500 includes a first phase-shifting cell 510, a second phase-shifting cell 520, and a third phase-shifting cell 530. The phase-shifting cells impose predetermined phase shifts which may be the same or different. In one embodiment, the first phase-shifting cell 510 may impose a 10° phase shift, the second phase-shifting cell 520 may impose a 10°, and the third phase-shifting cell may impose a 2.5° phase shift. One or more of these phase shifts may be different in another embodiment.

Each of the phase-shifting cell 510, 520, and 530 may include an arrangement as set forth in the embodiment of FIG. 5. For example, the first phase-shifting cell 510 includes a capacitor 511 with a first capacitance that is selectively coupled to transmission line TL1 by switch 512. The phase-shifted signal output from the first phase-shifting cell 510 is input into transmission line TL2. The second phase-shifting cell 520 includes a capacitor 521 with a second capacitance that is selectively coupled to transmission line TL3 by switch 522. The phase-shifted signal output from the second phase-shifting cell 520 is input into transmission line TL4. The third phase-shifting cell 530 includes a capacitor 531 with a third capacitance that is selectively coupled to transmission line TL5 by switch 532. The first, second, and third capacitances may, alone or coupled with the lengths of transmission lines TL1, TL3, and TL5, produce the intended phase-shift angles for respective ones of the phase-shifting cell. To avoid a scalar addition of the return loss failure if all cells are on or off, transmission lines TL2 and TL4 may be 50 Ohm transmission lines. Due to the phase rotation (for example, ~40°) of the slightly unmatched input impedance of transmission lines TL2 and TL4, good return loss values for all states may be reached.

Although the various exemplary embodiments have been described in detail with particular reference to certain exemplary aspects thereof, it should be understood that the invention is capable of other example embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

I claim:

1. A phase-shifting cell, comprising:
a transmission line conductor having a first end and a second end; and
a high-pass filter circuit configured to be selectively coupled in parallel with the transmission line conductor between the first end and the second end, wherein the transmission line conductor and the high-pass filter circuit are configured to receive respective portions of a divided input signal when the high-pass filter circuit is coupled in parallel to the transmission line conductor and wherein the high-pass filter circuit is configured to shift a phase of the input signal conveyed through the transmission line conductor by a predetermined phase angle when the high-pass filter circuit is coupled to the transmission line conductor.

2. The phase-shifting cell of claim 1, wherein the high-pass filter circuit comprises:
a first capacitor that may be selectively coupled in parallel to the transmission line conductor,
a first reactance coupled to the first end of the transmission line conductor and to the capacitor, and
a second reactance coupled to the second end of the transmission line conductor and to the capacitor.

3. The phase-shifting cell of claim 2, wherein the first capacitor is coupled between the first reactance and the second reactance by a first switch.

4. The phase-shifting cell of claim 3, further comprising:
a second switch coupled between the first reactance and a reference potential; and
a third switch coupled between the second reactance and the reference potential.

5. The phase-shifting cell of claim 4, wherein the first switch, second switch, and third switch are configured to be all simultaneously closed or all simultaneously opened.

6. The phase-shifting cell of claim 1, wherein the high-pass filter circuit comprises:
a first switch coupled to a first filter and a second filter;
a first reactance coupled to the first end of the transmission line conductor and the first filter; and
a second reactance coupled to the second end of the transmission line conductor and the second filter.

7. The phase-shifting cell of claim 6, wherein:
the first filter includes a first capacitor,
the second filter includes a second capacitor,
the first capacitor is configured to shift the input signal by a second phase angle, and
the second capacitor is configured to shift the input signal by a third phase angle.

8. The phase-shifting cell of claim 7, wherein the first phase angle is equal to a sum of the second phase angle and the third phase angle.

9. The phase-shifting cell of claim 7, wherein the first switch is coupled between the first capacitor and the second capacitor.

10. The phase-shifting cell of claim 6, further comprising:
a second switch configured to couple the first reactance and the second reactance to a reference potential.

11. The phase-shifting cell of claim 10, wherein:
the second switch is coupled between the first reactance and the second reactance, and
the first switch and the second switch are configured to simultaneously turn on or simultaneously turn off.

12. The phase-shifting cell of claim 1, wherein the high-pass filter circuit comprises:
a switch coupled to a first filter and a second filter; and
a reactance coupled between the switch and a reference potential.

13. The phase-shifting cell of claim 12, wherein:
the first filter includes a first capacitor,
the second filter includes a second capacitor,
the first capacitor is configured to shift the input signal by a second phase angle, and
the second capacitor is configured to shift the input signal by a third phase angle.

14. The phase-shifting cell of claim 13, wherein the first phase angle is equal to a sum of the second phase angle and the third phase angle.

15. The phase-shifting call of claim 13, wherein the switch is a three-way switch that simultaneously couples the first capacitor, the second capacitor, and the reactance.

16. A delay line comprising:
a first phase-shifting cell that includes
a first transmission line conductor having a first end and a second end, and
a first high-pass filter circuit configured to be selectively coupled in parallel with the first transmission line conductor between the first end and the second end, wherein the first transmission line conductor and the first high-pass filter circuit are configured to receive respective portions of a divided input signal when the first high-pass filter circuit is coupled in parallel to the first transmission line conductor and wherein the first high-pass filter circuit is configured to shift a phase of an input signal conveyed through the delay line by a first predetermined phase angle when the first high-pass filter circuit is coupled to the first transmission line conductor; and
a second phase-shifting cell that includes
a second transmission line conductor having a third end and a fourth end, wherein the third end of the second transmission line conductor is coupled to the second end of the first transmission line conductor, and
a second high-pass filter circuit configured to be selectively coupled in parallel with the second transmission line conductor between the third end and the fourth end, wherein the second high-pass filter circuit is configured to shift the phase of the input signal conveyed through the delay line by a second predetermined phase angle when the second high-pass filter circuit is coupled to the second transmission line conductor.

17. The delay line of claim 16, further comprising:
a controller configured to produce first and second control signals to selectively couple the first and second high-pass filter circuits to the first and second transmission line conductors.

18. The delay line of claim 17, wherein the controller is configured to produce the control signals based on a multibit control value in which a first bit determines whether the controller is to cause the first high-pass filter circuit to be coupled to the first transmission line conductor, and a second bit determines whether the controller is to cause the second high-pass filter circuit to be coupled to the second transmission line conductor.

19. The delay line of claim 16, wherein the first and second predetermined phase angles are equal.

20. The delay line of claim 16, wherein the first and second predetermined phase angles are different.

* * * * *